United States Patent
Okamoto et al.

(10) Patent No.: US 8,421,307 B2
(45) Date of Patent: Apr. 16, 2013

(54) ACOUSTIC WAVE DEVICE

(75) Inventors: Shoji Okamoto, Osaka (JP); Takashi Inoue, Osaka (JP); Takahiro Sato, Osaka (JP); Rei Goto, Osaka (JP); Hidehito Shimizu, Osaka (JP); Toru Jibu, Hyogo (JP)

(73) Assignee: Panasonic Corporation, Osaka (JP)

( * ) Notice: Subject to any disclaimer, the term of this patent is extended or adjusted under 35 U.S.C. 154(b) by 96 days.

(21) Appl. No.: 13/206,660

(22) Filed: Aug. 10, 2011

(65) Prior Publication Data

US 2012/0049690 A1 Mar. 1, 2012

(30) Foreign Application Priority Data

Aug. 27, 2010 (JP) ................................ 2010-190306

(51) Int. Cl.
*H01L 41/08* (2006.01)

(52) U.S. Cl.
USPC .................................. 310/313 D; 310/313 B

(58) Field of Classification Search .............. 310/313 B, 310/313 D, 313 R; 331/193–196
See application file for complete search history.

(56) References Cited

U.S. PATENT DOCUMENTS

| | | | | |
|---|---|---|---|---|
| 5,294,859 | A * | 3/1994 | Yamanouchi et al. | 310/313 B |
| 6,870,302 | B2 * | 3/2005 | Nakamura et al. | 310/313 B |
| 7,030,539 | B2 * | 4/2006 | Furukawa et al. | 310/313 D |
| 7,710,221 | B2 * | 5/2010 | Kajihara | 333/193 |
| 7,800,281 | B1 * | 9/2010 | Grama et al. | 310/313 D |
| 2002/0044497 | A1 | 4/2002 | Kachi et al. | |
| 2010/0141087 | A1 * | 6/2010 | Bostan et al. | 310/313 D |

FOREIGN PATENT DOCUMENTS

JP 2002-084162 A 3/2002

* cited by examiner

*Primary Examiner* — Mark Budd
(74) *Attorney, Agent, or Firm* — RatnerPrestia

(57) ABSTRACT

An acoustic wave device includes a piezoelectric substrate, an interdigital transducer (IDT) electrode, a reflector electrode, and a dummy electrode. The IDT electrode includes electrode fingers extending in a predetermined direction. The reflector electrode faces the IDT electrode across a gap. The dummy electrode is situated on a straight line extending in the predetermined direction through the gap. At least one of the distance between the dummy electrode and the IDT electrode and the distance between the dummy electrode and the reflector electrode is larger than the distance between the IDT electrode and the reflector electrode. This acoustic wave device prevents a short circuit between the IDT electrode and the reflector electrode, thereby avoiding a decrease in its yield.

13 Claims, 5 Drawing Sheets

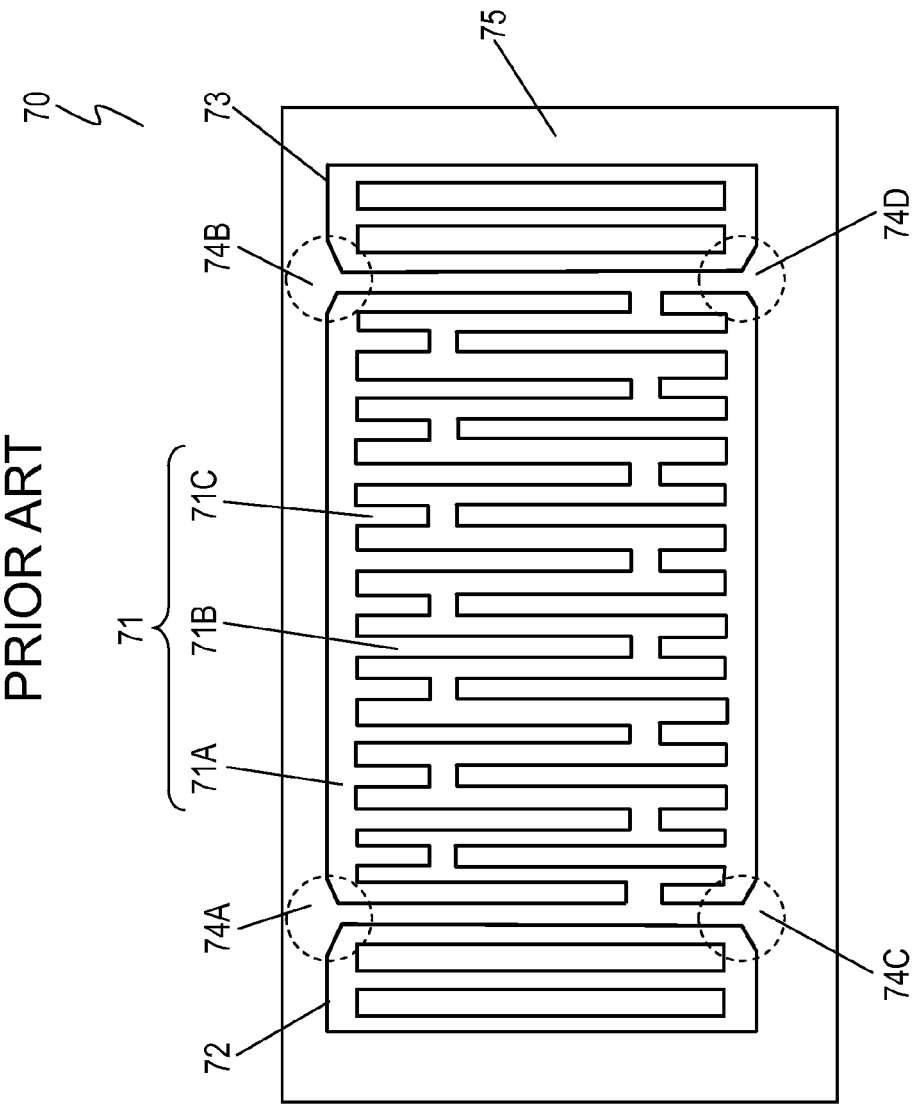

ACOUSTIC WAVE DEVICE

FIELD OF THE INVENTION

The present invention relates to an acoustic wave device used for telecommunications apparatuses, such as mobile phones.

BACKGROUND OF THE INVENTION

FIG. 5 is a schematic plan view of conventional acoustic wave device 70. Acoustic wave device 70 includes interdigital transducer (IDT) electrode 71 and reflector electrodes 72 and 73 formed on piezoelectric substrate 75. IDT electrode 71 is arranged between reflector electrodes 72 and 73.

IDT electrode 71 includes busbar 71A, interdigitating electrode fingers 71B and non-interdigitating electrode fingers 71C.

In acoustic wave device 70, IDT electrode 71 and reflector electrodes 72 and 73 have bevel portions at gaps 74A, 74B, 74C and 74D between them. Even though these bevel portions are formed for preventing a short circuit between IDT electrode 71 and reflector electrodes 72 and 73, there still arises a short circuit at any of gaps 74A, 74B, 74C and 74D between IDT electrode 71 and reflector electrodes 72 and 73, hence reducing the yield of acoustic wave device 70.

Japanese Patent Laid-Open Publication No. 2002-84162 discloses an acoustic wave device similar to conventional acoustic wave device 70.

SUMMARY OF THE INVENTION

An acoustic wave device includes a piezoelectric substrate, an interdigital transducer (IDT) electrode, a reflector electrode, and a dummy electrode. The IDT electrode includes electrode fingers extending in a predetermined direction. The reflector electrode faces the IDT electrode across a gap. The dummy electrode is situated on a straight line extending in the predetermined direction through the gap. At least one of the distance between the dummy electrode and the IDT electrode and the distance between the dummy electrode and the reflector electrode is larger than the distance between the IDT electrode and the reflector electrode.

This acoustic wave device prevents a short circuit between the IDT electrode and the reflector electrode, thereby avoiding a decrease in its yield.

BRIEF DESCRIPTION OF DRAWINGS

FIG. 5 is a schematic plan view of a conventional acoustic wave device.

DETAILED DESCRIPTION OF PREFERRED EMBODIMENTS

Exemplary Embodiment 1

Figure 1:
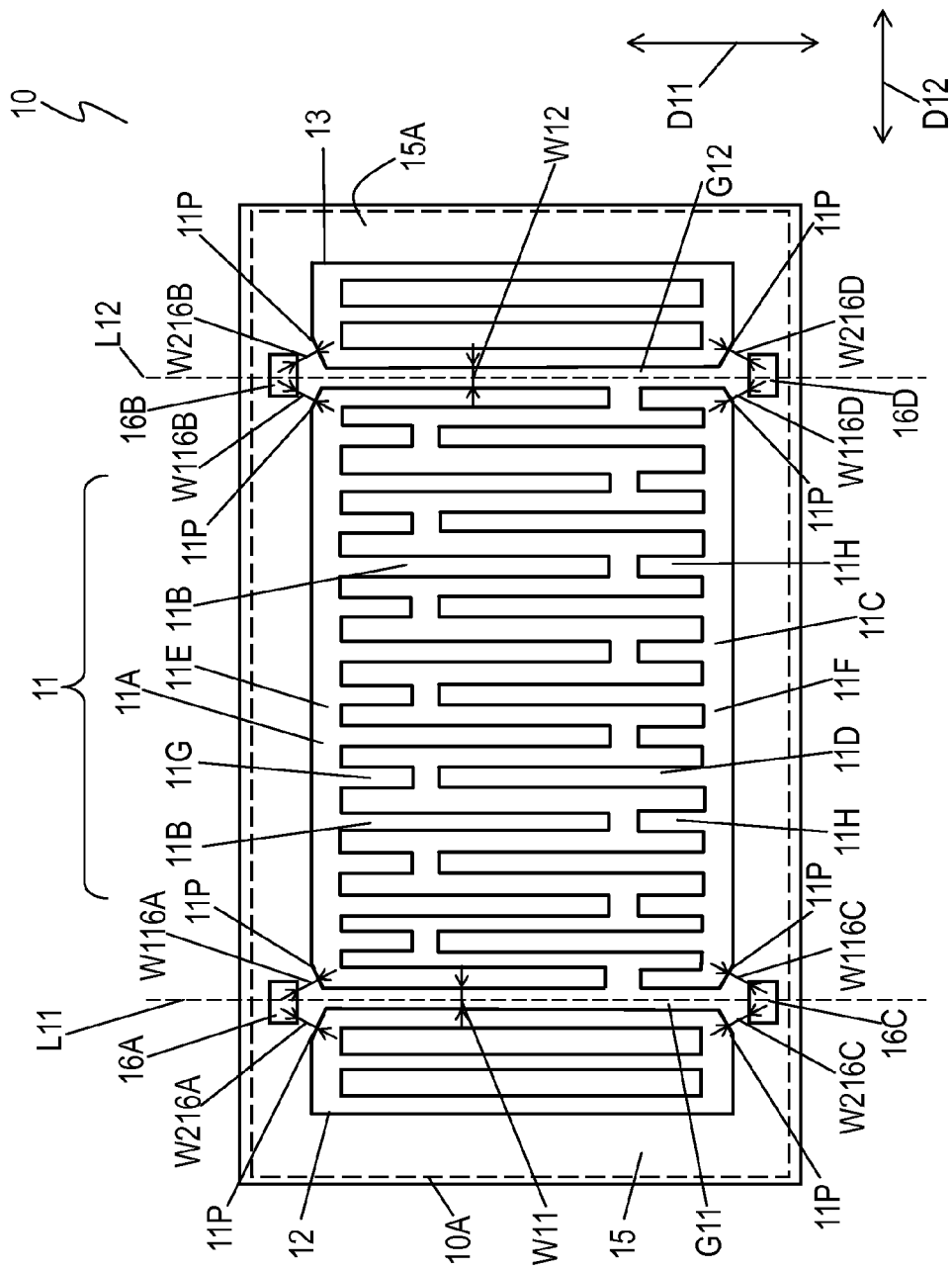
FIG. 1 is a schematic plan view of an acoustic wave device according to Exemplary Embodiment 1 of the present invention.

FIG. 1 is a schematic plan view of acoustic wave device 10 according to Exemplary Embodiment 1 of the present invention. Acoustic wave device 10 includes piezoelectric substrate 15 made of a piezoelectric material, interdigital transducer (IDT) electrode 11, reflector electrodes 12 and 13, and dummy electrodes 16A, 16B, 16C and 16D. IDT electrode 11, reflector electrodes 12 and 13, and dummy electrodes 16A, 16B, 16C and 16D are provided on upper surface 15A of piezoelectric substrate 15. Gap G11 is provided between IDT electrode 11 and reflector electrode 12, so that IDT electrode 11 faces reflector electrode 12 across gap G11 separating between them. Gap G12 is provided between IDT electrode 11 and reflector electrode 13, so that IDT electrode 11 faces reflector electrode 13 across gap G12. Electrode fingers of IDT electrode 11 extend in direction D11. Dummy electrodes 16A and 16C are situated on straight line L11 extending in direction D11 along gap G11, and are spaced from reflector electrode 12 and IDT electrode 11 by a predetermined distance. Dummy electrodes 16B and 16D are situated on straight line L12 extending through gap G12 in direction D11, and are spaced from reflector electrode 13 and IDT electrode 11 by predetermined distances.

IDT electrode 11 includes comb-shaped electrodes 11A and 11C. Comb-shaped electrode 11A includes busbar 11E extending in direction D12 non-parallel to and perpendicular to direction D11, plural interdigitating electrode fingers 11B extending in direction D11 toward comb-shaped electrode 11C from busbar 11E, and plural non-interdigitating electrode fingers 11G extending in direction D11 toward comb-shaped electrode 11C from busbar 11E. Comb-shaped electrode 11C includes busbar 11F extending in direction D12, plural interdigitating electrode fingers 11D extending in direction D11 toward comb-shaped electrode 11A from busbar 11F, and plural non-interdigitating electrode fingers 11H extending in direction D11 toward comb-shaped electrode 11A from busbar 11F. Comb-shaped electrodes 11A and 11C face each other such that interdigitating electrode fingers 11B interdigitate with interdigitating electrode fingers 11D. IDT electrode 11 is arranged between reflector electrode 12 and reflector electrode 13. A main acoustic wave excited on piezoelectric substrate 15 by IDT electrode 11 propagates in direction D12. Reflector electrodes 12 and 13 are arranged at both sides of IDT electrode 11 along the direction of D12.

In acoustic wave device 10, each of IDT electrode 11, reflector electrodes 12 and 13, and dummy electrodes 16A, 16B, 16C and 16D includes a main electrode layer mainly made of at least one of Al, Au, Ag, Cu, Fe, Ni, W, Ta, Pt, Mo, Cr, Ti, Zn, Ru, Co, $RuO_2$, ZnO, and ITO. These electrodes may have a multi-layered structure having two or more layers including a main electrode layer and another layer made of other materials out of the above materials. According to Embodiment 1, each of IDT electrode 11, reflector electrodes 12 and 13, and dummy electrodes 16A, 16B, 16C and 16D includes a bonding layer of Ti provided on upper surface 15A of piezoelectric substrate 15 and the main electrode layer made of Al provided on the bonding layer.

Not all of dummy electrodes 16A, 16B, 16C and 16D are necessarily provided. At least one of the dummy electrodes 16A, 16B, 16C and 16D may provide on the piezoelectric substrate to provide the same effects.

Bevel portions 11P may be provided at portions of IDT electrode 11 and reflector electrodes 12 and 13 that face gap G11 or G12 in order to prevent a short circuit between IDT electrode 11 and reflector electrodes 12 and 13.

Acoustic wave device 10 may includes dielectric layer 10A made of a dielectric material, such as silicon oxide ($SiO_2$), provided on upper surface 15A of piezoelectric substrate 15 so as to cover reflector electrodes 12 and 13, IDT electrode 11, and dummy electrodes 16A, 16B, 16C and 16D.

Interdigitating electrode fingers 11B interdigitate with interdigitating electrode fingers 11D while non-interdigitating electrode fingers 11G do not interdigitate with non-interdigitating electrode fingers 11H. IDT electrode 11 may not necessarily include any of non-interdigitating electrode fingers 11G and 11H.

IDT electrode 11 and reflector electrode 12 are separated from each other by a predetermined distance (the shortest distance) W11 provided by the width of gap G11 in direction D12. IDT electrode 11 and reflector electrode 13 are separated from each other by a predetermined distance (the shortest distance) W12 provided by the width of gap G12 in direction D12.

Dummy electrode 16A is separated from comb-shaped electrode 11A of IDT electrode 11 and reflector electrode 12 by predetermined distances (the shortest distances) W116A and W216A, respectively. Predetermined distances W116A and W216A are larger than predetermined distance W11. However, only at least one of predetermined distances W116A and W216A can be larger than predetermined distance W11.

Dummy electrode 16B is separated from comb-shaped electrode 11A of IDT electrode 11 and reflector electrode 13 by predetermined distances (the shortest distances) W116B and W216B, respectively. Predetermined distances W116B and W216B are larger than predetermined distance W12. However, only at least one of predetermined distances W116B and W216B can be larger than predetermined distance W12.

Dummy electrode 16C is separated from comb-shaped electrode 11C of IDT electrode 11 and reflector electrode 12 by predetermined distances (the shortest distances) W116C and W216C, respectively. Predetermined distances W116C and W216C are larger than predetermined distance W11. However, only at least one of predetermined distances W116C and W216C can be larger than predetermined distance W11.

Dummy electrode 16D is separated from comb-shaped electrode 11C of IDT electrode 11 and reflector electrode 13 by predetermined distances (the shortest distances) W116D and W216D, respectively. Predetermined distances W116D and W216D are larger than predetermined distance W12. However, only at least one of predetermined distances W116D and W216D can be larger than predetermined distance W12.

Predetermined distances W116A to W116D and W216A to W216D are smaller than a wavelength of the main acoustic wave excited by IDT electrode 11.

A method of manufacturing acoustic wave device 10 will be described below.

First, an electrode film made any of the above-mentioned materials is formed on upper surface 15A of piezoelectric substrate 15 by a method, such as evaporation, spattering or chemical vapor deposition. Next, a resist film is formed on an upper surface of the electrode film, and is processed to a desired shape by photolithography. The electrode film is then processed to have desired shapes of IDT electrode 11, reflector electrodes 12 and 13, and dummy electrodes 16A, 16B, 16C and 16D by dry etching, and then, the resist film is removed. Finally, piezoelectric substrate 15 is divided by dicing into individual pieces of acoustic wave device 10.

In conventional acoustic wave device 70 show in FIG. 5, the dry etching may remove the electrode film insufficiently from gaps 74A, 74B, 74C and 74D between IDT electrode 71 and reflector electrodes 72 and 73, which tends to have undesired residues of the electrode film remain during the dry etching to form IDT electrode 71 and reflector electrodes 72 and 73. This may cause a short circuit across gap 74A, 74B, 74C or 74D between IDT electrode 71 and reflector electrodes 72 and 73, hence reducing the yield.

Gaps 74A to 74D between IDT electrode 71 and reflector electrodes 72 and 73 have a large opening ratio, accordingly requiring a large area to be etched by the dry etching. Here, the opening ratio is the ratio of an area where the resist film is not formed to the sum of all areas where the resist film is formed and not formed in the above manufacturing process. This may prevent an etching gas used for the dry etching from being supplied properly, and may cause residues of the electrode film to remain between the electrodes as a result of instability of the etching.

In acoustic wave device 10 according to Embodiment 1, dummy electrodes 16A, 16B, 16C and 16D locally reduce the opening ratios of the resist film around gaps G11 and G12 between IDT electrode 11 and reflector electrodes 12 and 13, thereby decreasing the area to be etched by the dry etching of the resist film. This reduces a reacting amount of the etching gas used for the dry etching, and supplies a sufficient amount of the etching gas to gaps G11 and G12 through spaces at predetermined distances W116A to W116D and W216A to W216D between dummy electrodes 16A, 16B, 16C, 16D and reflector electrode 12, reflector electrode 13 and IDT electrode 11, hence etching the electrode film stably. This configuration eliminates undesired residues of the electrode film, and avoids a short circuit between IDT electrode 11 and reflector electrodes 12 and 13, thus preventing its yield from being reduced. The above effect becomes more apparent when predetermined distances W116A to W116D and W216A to W216D are larger than predetermined distances W12 and W12, and smaller than the wavelength of the main acoustic wave excited by IDT electrode 11.

Figure 2:
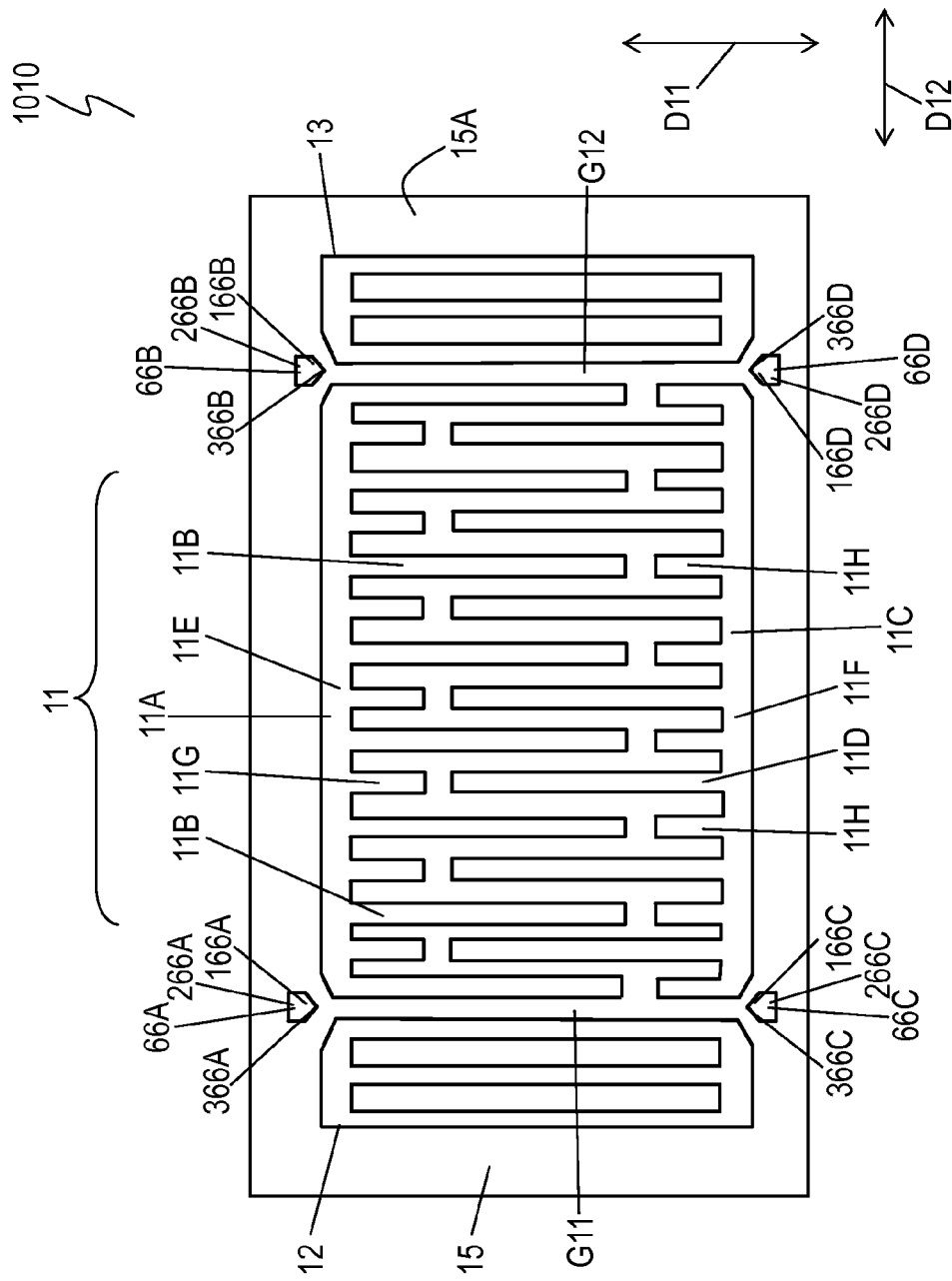
FIG. 2 is a schematic plan view of another acoustic wave device according to Embodiment 1.

FIG. 2 is a schematic plan view of another acoustic wave device 1010 according to Embodiment 1. In FIG. 2, components identical to those of acoustic wave device 10 shown in FIG. 1 are denoted by the same reference numerals. Acoustic wave device 1010 shown in FIG. 2 includes dummy electrodes 66A, 66B, 66C, and 66D instead of dummy electrodes 16A, 16B, 16C, and 16D of acoustic wave device 10 shown in FIG. 1. Relative distances among dummy electrodes 66A to 66D, IDT electrode 11, and reflector electrodes 12 and 13 are identical to those of dummy electrodes 16A to 16D, IDT electrode 11, and reflector electrodes 12 and 13 of acoustic wave device 10 shown in FIG. 1.

Dummy electrode 66A preferably has a shape such that portion 166A of dummy electrode 66A has a width in direction D12 smaller than that of portion 266A of dummy electrode 66A that is farther from gap G11 than portion 166A is. Dummy electrode 66A preferably has protruding portion 366A with a tip tapered toward gap G11.

Similarly, dummy electrode 66B preferably has a shape such that portion 166B of dummy electrode 66B has a width in direction D12 smaller than that of another portion 266B of dummy electrode 66B that is farther from gap G12 than portion 166B is. Dummy electrode 66B preferably has protruding portion 366B with a tip tapered toward gap G12.

Similarly, dummy electrode 66C preferably has a shape such that portion 166C of dummy electrode 66C has a width in direction D12 smaller than that of portion 266C of dummy electrode 66C that is farther from gap G11 than portion 166C is. Dummy electrode 66C preferably has protruding portion 366C with a tip tapered toward gap G11.

Similarly, dummy electrode 66D preferably has a shape such that portion 166D of dummy electrode 66D has a width in direction D12 smaller than that of portion 266D of dummy electrode 66D that is farther from gap G12 than portion 166D is. Dummy electrode 66D preferably has protruding portion 366D with a tip tapered toward gap G12.

This structure can facilitate supplying the etching gas efficiently to gaps G11 and G12 through the spaces at predetermined distances W116A to W116D and W216A to W216D between dummy electrodes 66A, 66B, 66C, 66D and reflector electrode 12, reflector electrode 13 and IDT electrode 11 (see FIG. 1). This can thus achieve stable etching of the electrode film. This structure eliminates undesired residues of the electrode film, hence avoiding a short circuit between IDT electrode 11 and reflector electrodes 12 and 13, thereby preventing a reduction of the yield.

Exemplary Embodiment 2

Figure 3:
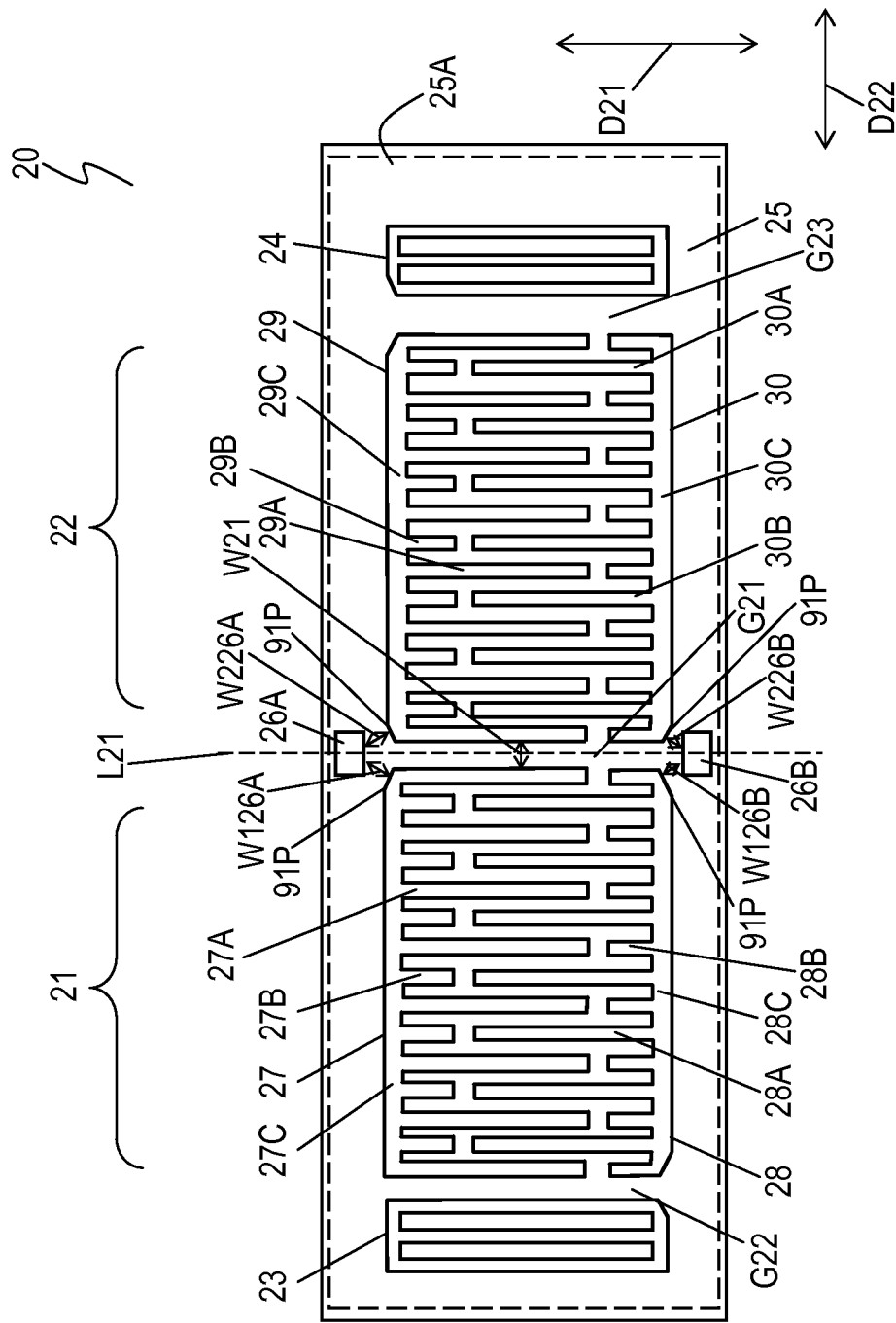
FIG. 3 is a schematic plan view of an acoustic wave device according to Exemplary Embodiment 2 of the invention.

FIG. 3 is a schematic plan view of acoustic wave device 20 according to Exemplary Embodiment 2 of the present invention. In FIG. 3, acoustic wave device 20 includes piezoelectric substrate 25, interdigital transducer (IDT) electrodes 21 and 22, reflector electrodes 23 and 24, and dummy electrodes 26A and 26B. IDT electrodes 21 and 22, reflector electrodes 23 and 24, and dummy electrodes 26A and 26B are provided on upper surface 25A of piezoelectric substrate 25. Gap G21 is provided between IDT electrodes 21 and 22, so that IDT electrodes 21 and 22 face each other across gap G21. Gap G22 is provided between IDT electrode 21 and reflector electrode 23, so that IDT electrode 21 faces reflector electrode 23 across gap G22. Gap G23 is provided between IDT electrode 22 and reflector electrode 24, so that IDT electrode 22 faces reflector electrode 24 across gap G23. Electrode fingers of IDT electrodes 21 and 23 extend in direction D21. Dummy electrodes 26A and 26B are situated on straight line L21 extending through gap G21 in direction D21, and are spaced from IDT electrodes 21 and 22 by predetermined distances.

IDT electrode 21 includes comb-shaped electrodes 27 and 28. Comb-shaped electrode 27 includes busbar 27C extending in direction D22 non-parallel to, perpendicular to direction D21, plural interdigitating electrode fingers 27A extending in direction D21 toward comb-shaped electrode 28 from busbar 27C, and plural non-interdigitating electrode fingers 27B extending in direction D21 toward comb-shaped electrode 28 from busbar 27C. Comb-shaped electrode 28 includes busbar 28C extending in direction D22, plural interdigitating electrode fingers 28A extending in direction D21 toward comb-shaped electrode 27 from busbar 28C, and plural non-interdigitating electrode fingers 28B extending in direction D21 toward comb-shaped electrode 27 from busbar 28C. Comb-shaped electrode 27 faces comb-shaped electrode 28 such that interdigitating electrode fingers 27A interdigitate with interdigitating electrode fingers 28A.

IDT electrode 22 includes comb-shaped electrodes 29 and 30. Comb-shaped electrode 29 includes busbar 29C extending in direction D22, plural interdigitating electrode fingers 29A extending in direction D21 toward comb-shaped electrode 30 from busbar 29C, and plural non-interdigitating electrode fingers 29B extending in direction D21 toward comb-shaped electrode 30 from busbar 29C. Comb-shaped electrode 30 includes busbar 30C extending in direction D22, plural interdigitating electrode fingers 30A extending in direction D21 toward comb-shaped electrode 29 from busbar 30C, and plural non-interdigitating electrode fingers 30B extending in direction D21 toward comb-shaped electrode 29 from busbar 30C. Comb-shaped electrode 29 faces comb-shaped electrode 30 such that interdigitating electrode fingers 29A interdigitate with interdigitating electrode fingers 30A.

IDT electrodes 21 and 22 are arranged between reflector electrodes 23 and 24. A main acoustic wave excited by IDT electrodes 21 and 22 propagates in direction D22. Reflector electrodes 23 and 24 are hence arranged at both sides of IDT electrodes 21 and 22 along direction D22.

Each of IDT electrodes 21 and 22, reflector electrodes 23 and 24, and dummy electrodes 26A and 26B includes a main electrode layer made mainly of at least one of Al, Au, Ag, Cu, Fe, Ni, W, Ta, Pt, Mo, Cr, Ti, Zn, Ru, Co, $RuO_2$, ZnO and ITO. Any of these electrodes may have a multi-layered structure including plural layers including this main electrode layer and another layer made of another material out of the above materials. According to Embodiment 2, each of IDT electrodes 21 and 22, reflector electrodes 23 and 24, and dummy electrodes 26A and 26B includes a bonding layer made of Ti provided on upper surface 25A of piezoelectric substrate 25 and the main electrode layer made of Al provided on the bonding layer.

Not both of dummy electrodes 26A and 26D are necessarily provided. At least one of these electrodes may provide on the piezoelectric substrate to provide the same effects.

Bevel portions 91P may be provided at portions of IDT electrodes 21 and 22 that face gap G21 in order to prevent a short circuit between IDT electrodes 21 and 22.

Interdigitating electrode fingers 27A interdigitate with interdigitating electrode fingers 28A while non-interdigitating electrode fingers 27B do not interdigitate with non-interdigitating electrode fingers 28B. IDT electrode 21 may not necessarily include any of non-interdigitating electrode fingers 27B and 28B. Similarly, interdigitating electrode fingers 29A interdigitate with interdigitating electrode fingers 30A while non-interdigitating electrode fingers 29B do not interdigitate with non-interdigitating electrode fingers 30B. IDT electrode 22 may not necessarily include any of non-interdigitating electrode fingers 29B and 30B.

IDT electrodes 21 and 22 are separated from each other by a predetermined distance (the shortest distance) W21 provided by the width of gap G21 in direction D22.

Dummy electrode 26A is spaced from comb-shaped electrode 27 of IDT electrode 21 and comb-shaped electrode 29 of IDT electrode 22 by predetermined distances (the shortest distances) W126A and W226A, respectively. Predetermined distances W126A and W226A are larger than predetermined distance W21. However, only at least one of predetermined distances W126A and W226A can be larger than predetermined distance W21.

Dummy electrode 26B is spaced from comb-shaped electrode 28 of IDT electrode 21 and comb-shaped electrode 30 of IDT electrode 22 by predetermined distances (the shortest distances) W126B and W226B, respectively. Predetermined distances W126B and W226B are larger than predetermined distance W21. However, only at least one of predetermined distances W126B and W226B can be larger than predetermined distance W21.

A method of manufacturing acoustic wave device 20 will be described.

First, an electrode film is formed on upper surface 25A of piezoelectric substrate 25 with any of the above mentioned materials by a method, such as evaporation, spattering, or chemical vapor deposition. Next, a resist film is formed on an upper surface of the electrode film, and the resist film is processed to have a desired shape by photolithography. The electrode film is then processed to have desired shapes of IDT electrodes 21 and 22, reflector electrodes 23 and 24, and dummy electrodes 26A and 26B by dry etching, and then, the resist film is removed. Finally, piezoelectric substrate 25 is divided by dicing into obtain individual pieces of acoustic wave device 20.

In acoustic wave device 20 according to Embodiment 2, dummy electrodes 26A and 26B locally reduces an opening ratio in the areas around gap G21 between IDT electrodes 21 and 22, thereby decreasing the area to be etched in the process of dry etching. This reduces a reacting amount of the etching gas used for the dry etching, and facilitates supplying a sufficient amount of the etching gas to gap G21 through the spaces at predetermined distances W126A, W126B, W226A and W226B between dummy electrodes 26A and 26B and IDT electrodes 21 and 22, hence etching the electrode film stably. This configuration can eliminate undesired residues of the electrode film and avoid a short circuit between IDT electrodes 21 and 22, thereby preventing the yield of acoustic wave device 20 from being reduced.

The above effect becomes more apparent in the case that the predetermined distances W126A, W126B, W226A and W226B are larger than predetermined distance W21 and are smaller than the wavelength of the main acoustic wave excited by IDT electrodes 21 and 22.

Figure 4:
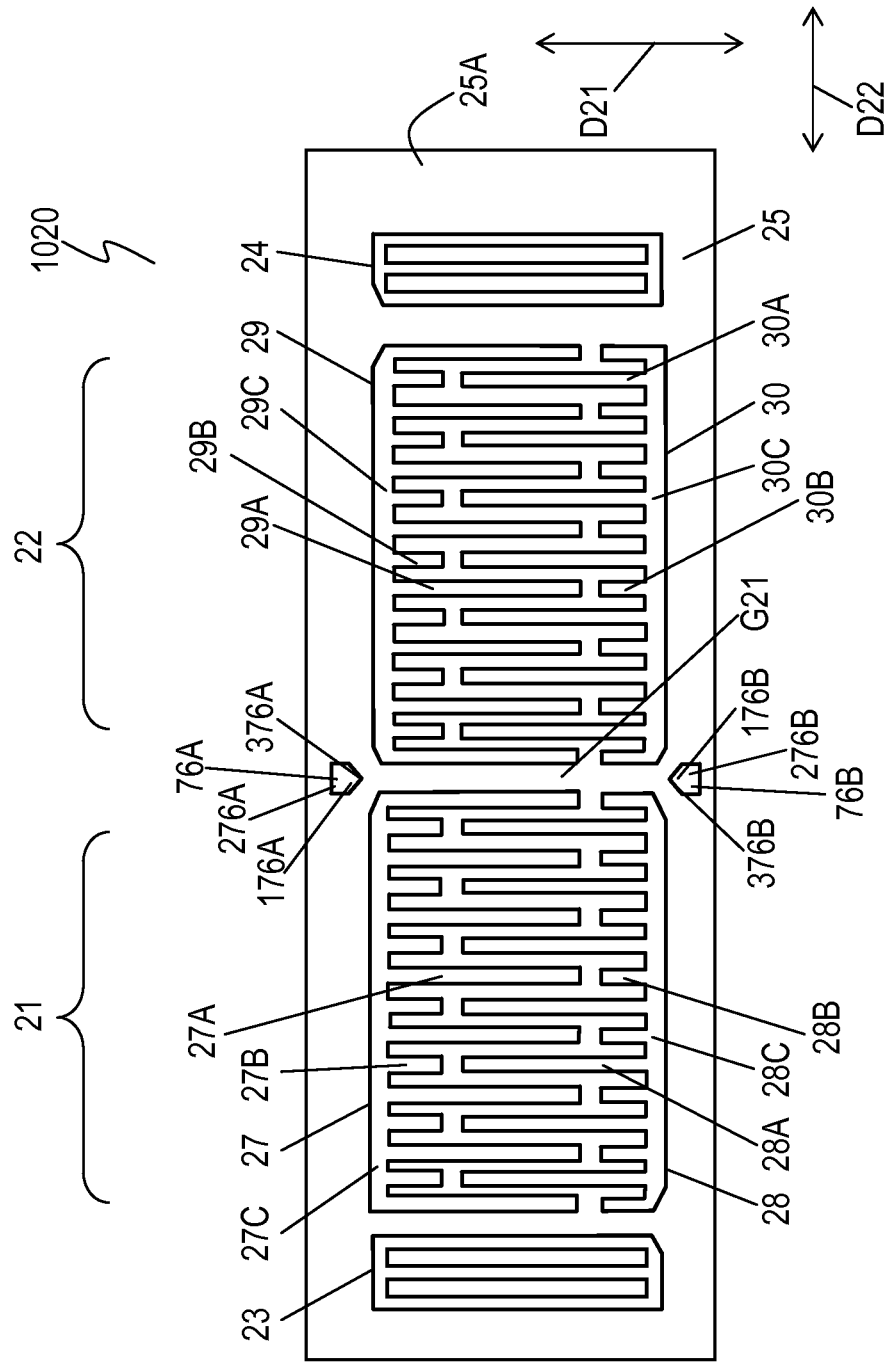
FIG. 4 is a schematic plan view of another acoustic wave device according to Embodiment 2.

FIG. 4 is a schematic plan view of another acoustic wave device 1020 according to Embodiment 2. In FIG. 4, components identical to those of acoustic wave device 20 shown in FIG. 3 are denoted by the same reference numerals. Acoustic wave device 1020 shown in FIG. 4 includes dummy electrodes 76A and 76B instead of dummy electrodes 26A and 26B of acoustic wave device 20 shown in FIG. 3. Relative distances among dummy electrodes 76A and 76B and IDT electrodes 21 and 22 are identical to those of dummy electrodes 26A and 26B and IDT electrodes 21 and 22 of acoustic wave device 20 shown in FIG. 3.

Dummy electrode 76A preferably has a shaped such that portion 176A of dummy electrode 76A has a width in direction D22 smaller than that of portion 276A of dummy electrode 76A that is farther from gap G21 than portion 176A is. Dummy electrode 76A preferably has protruding portion 376A with a tip tapered toward gap G21.

Dummy electrode 76B preferably has a shape such that portion 176B of dummy electrode 76B has a width in direction D22 smaller than that of portion 276B of dummy electrode 76B that is farther from gap G21 than portion 176B is. Dummy electrode 76B preferably has protruding portion 376B with a tip tapered toward gap G21.

This structure facilitates supplying the etching gas efficiently to gap G21 through the spaces at predetermined distances W176A, 175B, 276A, and 276B between those of dummy electrodes 76A and 76B and IDT electrodes 21 and 22 (see FIG. 3). This can thus achieve stable etching of the electrode film. This structure eliminates undesired residues of the electrode film, and prevents a short circuit between IDT electrodes 21 and 22, thereby avoiding a decrease in the yield of acoustic wave device 1020.

According to Embodiments 1 and 2, terms, such as "upper surface", indicating directions merely indicate relative directions depending only upon positional relations of components, such as the piezoelectric substrate and the IDT electrodes, of the acoustic wave devices, and do not indicate absolute directions, such as a vertical direction.

Acoustic wave devices 10, 20, 1010, and 1020 according to Embodiments 1 and 2 avoid a decrease of the yield, and are adaptable for use in electronic apparatuses, such as mobile telecommunications apparatuses.

What is claimed is:

1. An acoustic wave device comprising:
a piezoelectric substrate;
an interdigital transducer (IDT) electrode provided on an upper surface of the piezoelectric substrate, the IDT electrode including a plurality of electrode fingers extending in a predetermined direction;
a reflector electrode provided on the upper surface of the piezoelectric substrate, the reflector electrode facing the IDT electrode across a gap; and
a dummy electrode provided on the upper surface of the piezoelectric substrate, the dummy electrode being situated on a straight line extending in the predetermined direction through the gap, the dummy electrode being spaced from the reflector electrode and the IDT electrode,
wherein at least one of a first predetermined distance between the dummy electrode and the IDT electrode and a second predetermined distance between the dummy electrode and the reflector electrode is larger than a third predetermined distance between the IDT electrode and the reflector electrode.

2. The acoustic wave device of claim 1, wherein both of the first predetermined distance and the second predetermined distance are larger than the third predetermined distance.

3. The acoustic wave device of claim 2, wherein the first predetermined distance and the second predetermined distance are smaller than a wavelength of a main acoustic wave excited by the IDT electrode.

4. The acoustic wave device of claim 1, wherein the first predetermined distance and the second predetermined distance are smaller than a wavelength of a main acoustic wave excited by the IDT electrode.

5. The acoustic wave device of claim 1, further comprising a dielectric layer covering the reflector electrode and the IDT electrode.

6. The acoustic wave device of claim 1,
wherein the dummy electrode has a first portion and a second portion which is farther from the gap than the first portion is, and
wherein, in a direction of propagation of a main acoustic wave excited by the IDT electrode, the first portion has a width smaller than a width of the second portion.

7. The acoustic wave device of claim 1, wherein the dummy electrode has a protruding portion with a tip tapered toward the gap.

8. An acoustic wave device comprising:
a piezoelectric substrate;
a first interdigital transducer (IDT) electrode provided on an upper surface of the piezoelectric substrate, the first IDT electrode having a plurality of first electrode fingers extending in a predetermined direction;
a second IDT electrode provided on the upper surface of the piezoelectric substrate, the second IDT electrode facing the first IDT electrode across a gap, the second IDT electrode including a plurality of second electrode fingers extending in the predetermined direction; and
a dummy electrode provided on the upper surface of the substrate, the dummy electrode being situated on a straight line extending in the predetermined direction through the gap, the dummy electrode being spaced from the first IDT electrode and the second IDT electrode,
wherein at least one of a first predetermined distance between the dummy electrode and the first IDT electrode and a second predetermined distance between the dummy electrode and the second IDT electrode is larger than a third predetermined distance between the first IDT electrode and the second IDT electrode.

9. The acoustic wave device of claim 8, wherein both of the first predetermined distance and the second predetermined distance are larger than the third predetermined distance.

10. The acoustic wave device of claim 9, wherein the first predetermined distance and the second predetermined distance are smaller than a wavelength of a main acoustic wave excited by the first IDT electrode.

11. The acoustic wave device of claim 8, wherein the first predetermined distance and the second predetermined distance are smaller than a wavelength of a main acoustic wave excited by the first IDT electrode.

12. The acoustic wave device of claim 8,
   wherein the dummy electrode has a first portion and a second portion which is farther from the gap than the first portion is, and
   wherein, in a direction of propagation of a main acoustic wave excited by the first IDT electrode, the first portion has a width smaller than a width of the second portion.

13. The acoustic wave device of claim 8, wherein the dummy electrode has a protruding portion with a tip tapered toward the gap.

* * * * *